United States Patent
Palker et al.

(10) Patent No.: US 7,350,884 B2
(45) Date of Patent: Apr. 1, 2008

(54) TRAY WITH INTEGRATED RAIL GUIDES FOR FACILITATING INSTALLATION OF EQUIPMENT UNITS INTO A CABINET RACK

(75) Inventors: John Palker, South Grafton, MA (US); Melissa Silvestro, Uxbridge, MA (US); Joseph P. DeYesso, Walpole, MA (US); Albert F. Beinor, Jr., Sutton, MA (US)

(73) Assignee: EMC Corporation, Hopkinton, MA (US)

( * ) Notice: Subject to any disclaimer, the term of this patent is extended or adjusted under 35 U.S.C. 154(b) by 218 days.

(21) Appl. No.: 10/812,262

(22) Filed: Mar. 29, 2004

(65) Prior Publication Data

US 2005/0211647 A1    Sep. 29, 2005

(51) Int. Cl.
*A47B 88/04* (2006.01)
(52) U.S. Cl. .................................... 312/334.1
(58) Field of Classification Search ............. 312/330.1, 312/334.1, 334.7, 223.2; 211/26; 361/724, 361/725, 726, 727, 683, 684, 685, 686, 687
See application file for complete search history.

(56) References Cited

U.S. PATENT DOCUMENTS

| | | | | |
|---|---|---|---|---|
| 3,133,768 A | * | 5/1964 | Klakovich | 384/17 |
| 4,440,461 A | * | 4/1984 | Powell et al. | 312/334.8 |
| 5,626,406 A | * | 5/1997 | Schmid | 312/334.28 |
| 5,921,644 A | * | 7/1999 | Brunel et al. | 312/223.2 |
| 6,052,277 A | * | 4/2000 | Liu et al. | 361/685 |
| 6,142,590 A | * | 11/2000 | Harwell | 312/223.1 |
| 6,201,690 B1 | * | 3/2001 | Moore et al. | 361/683 |
| 6,201,702 B1 | * | 3/2001 | Schmitt | 361/725 |
| 6,373,695 B1 | * | 4/2002 | Cheng | 361/685 |
| 6,392,878 B1 | * | 5/2002 | Noh | 361/685 |
| 6,511,139 B2 | * | 1/2003 | Liu | 312/223.2 |
| 6,989,983 B2 | * | 1/2006 | Rumney | 361/679 |
| 6,999,307 B2 | * | 2/2006 | Peng | 361/685 |
| 7,042,710 B1 | * | 5/2006 | Beseth et al. | 361/679 |
| 2003/0042215 A1 | * | 3/2003 | Tomino | 211/26 |
| 2004/0227441 A1 | * | 11/2004 | Wang et al. | 312/334.8 |

* cited by examiner

*Primary Examiner*—James O. Hansen
(74) *Attorney, Agent, or Firm*—Guerin & Rodriguez LLP; Michael A. Rodriguez

(57) ABSTRACT

Described is an equipment tray having integrated rail guides. The tray has a base sized for supporting a unit of electronic equipment, a back wall extending perpendicularly from the base at a back end of the tray, and opposing side walls spatially separated by the base. Each side wall extends from front to back to meet the back wall. Each side wall has at least one upper rail guide and at least one lower rail guide extending laterally from that side wall. The at least one lower rail guide is spatially separated from and opposite to the at least one upper rail guide. The upper and lower rail guides slidably engage a portion of a side rail when the tray is installed in the cabinet rack. Each side wall also has a flange at the front end for attaching the tray to a mounting rail of a cabinet rack.

10 Claims, 13 Drawing Sheets

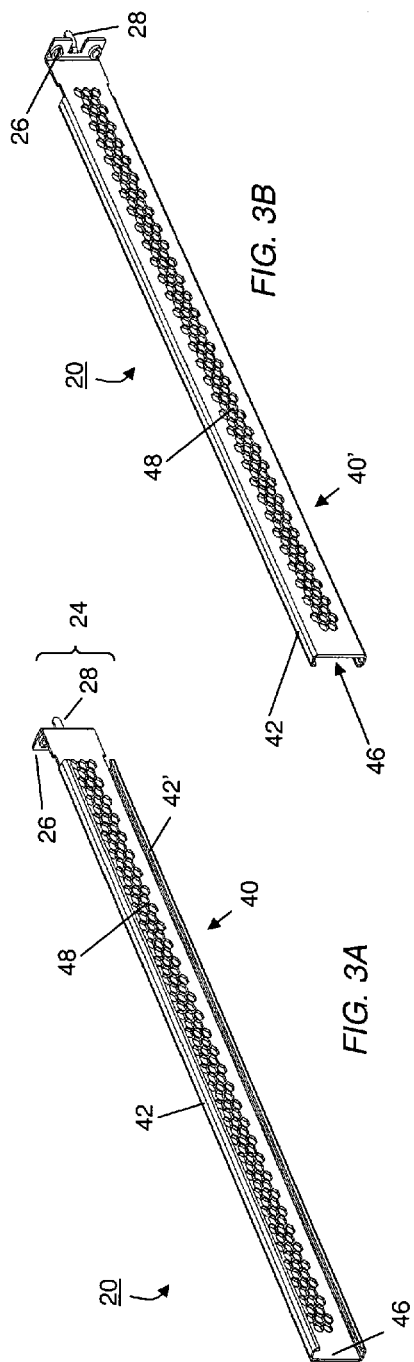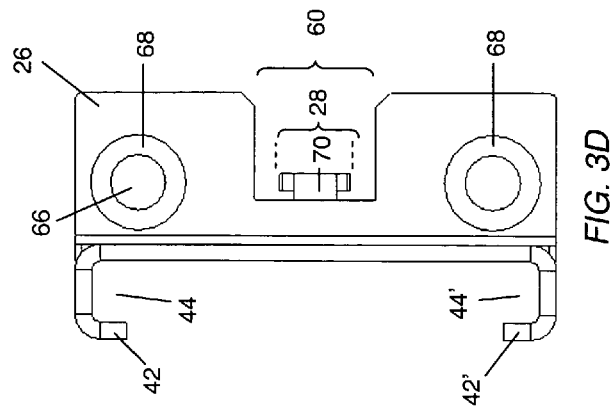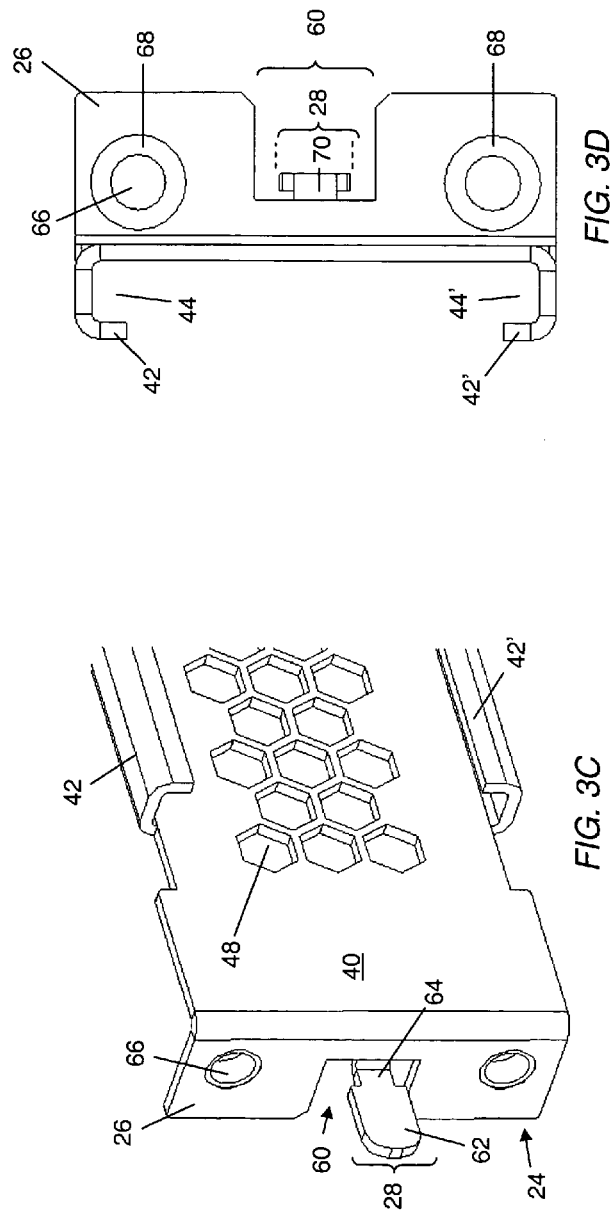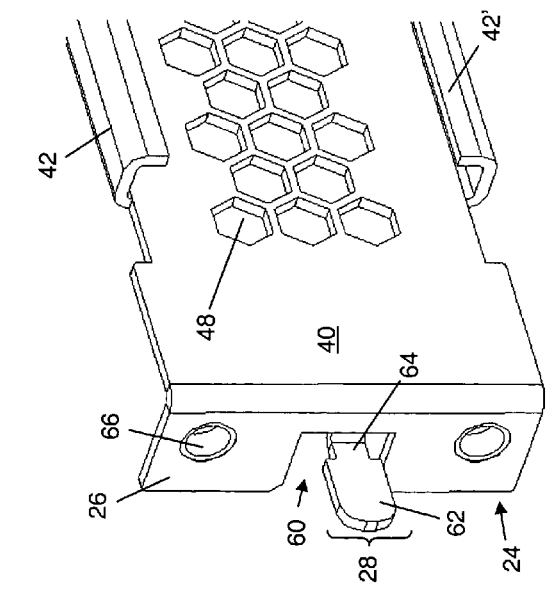

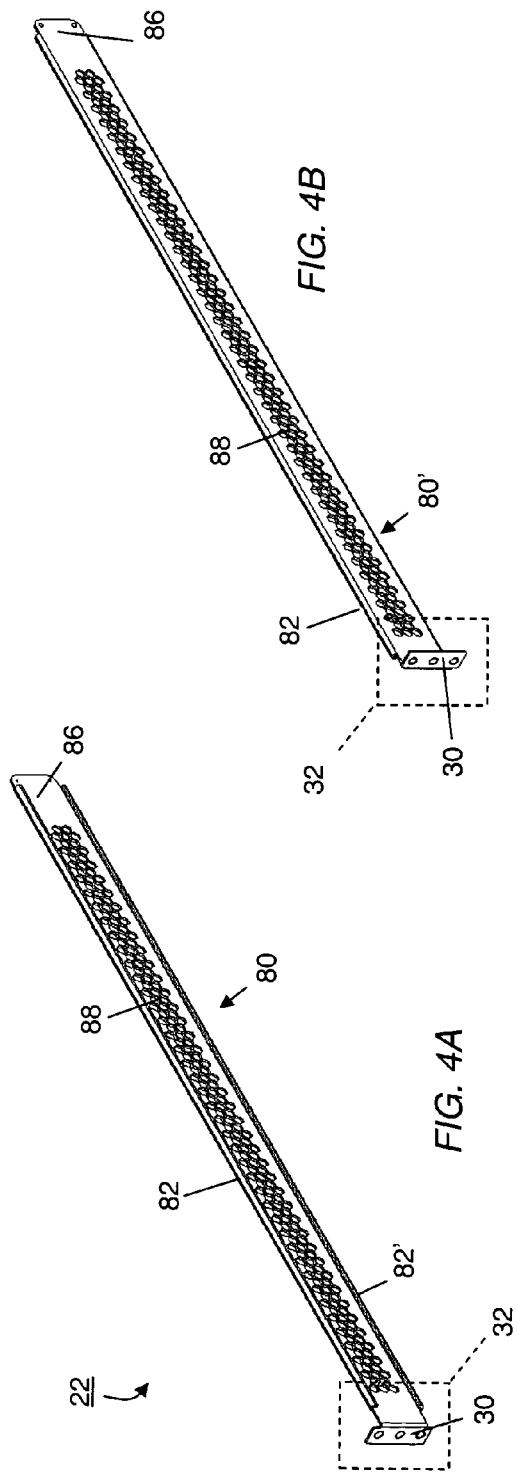
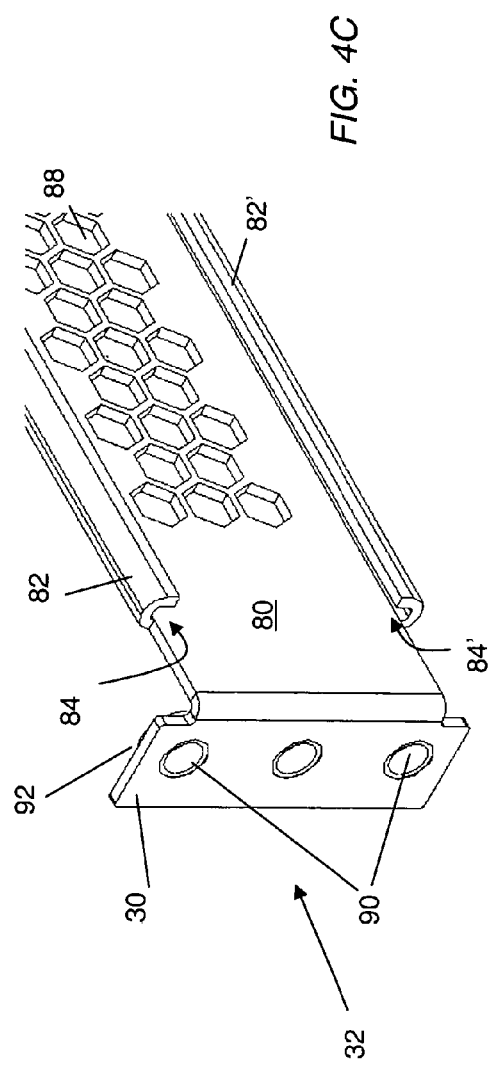
FIG. 4A
FIG. 4B
FIG. 4C

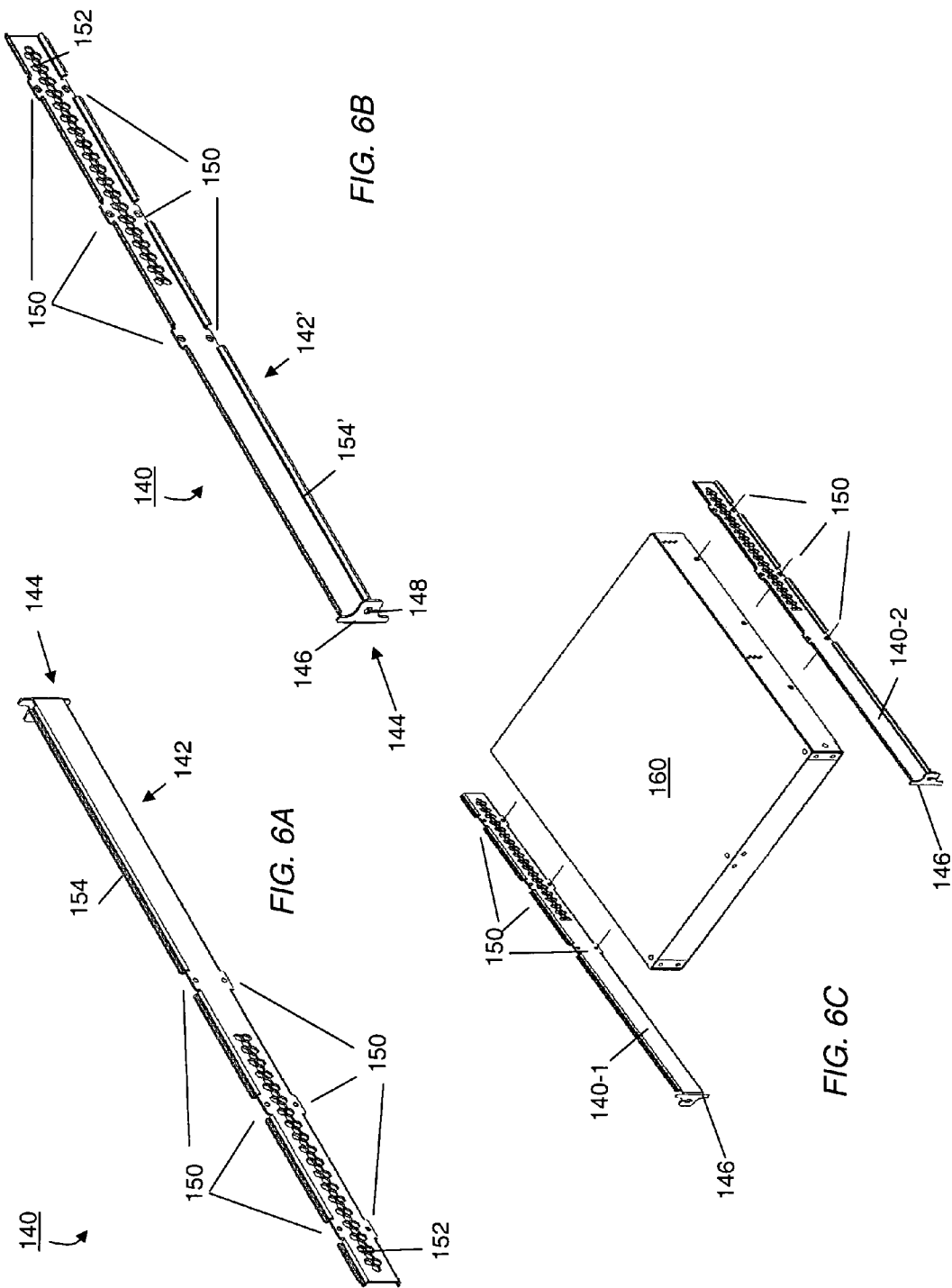

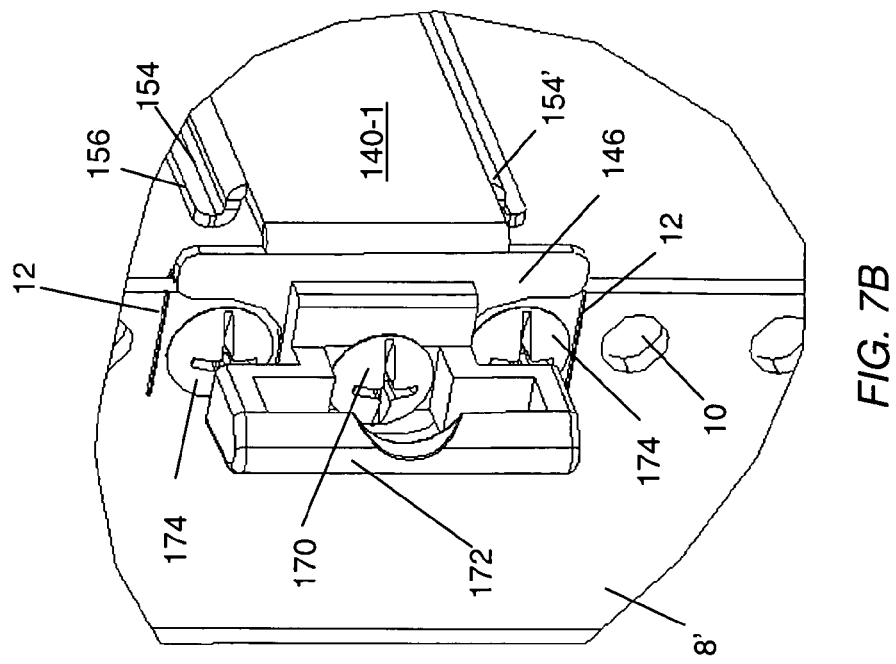
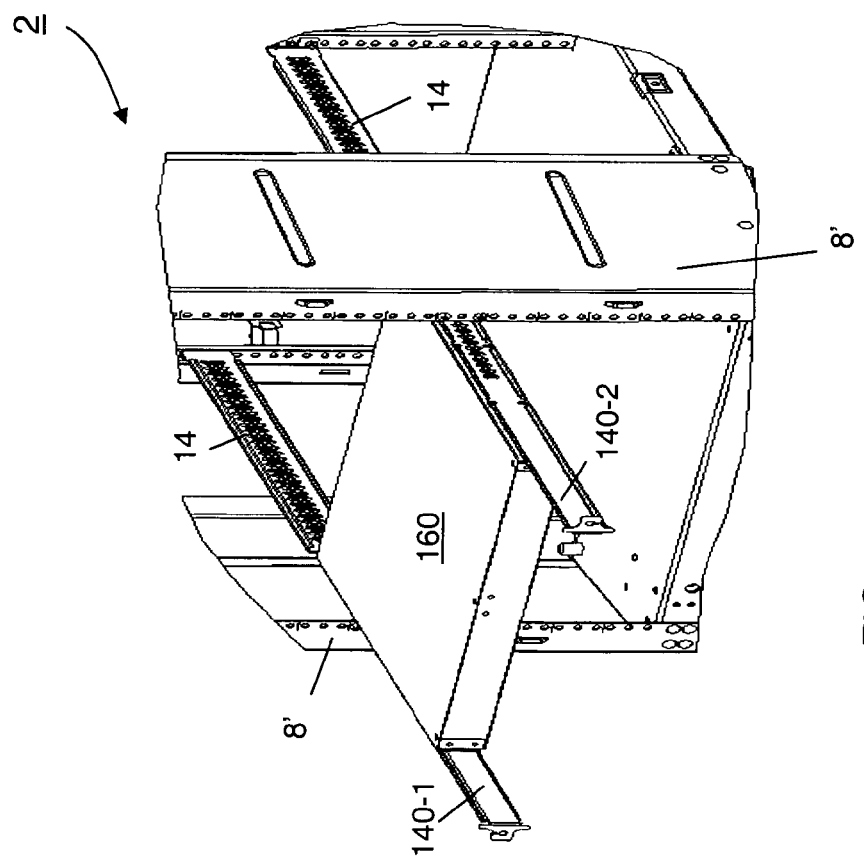
FIG. 7A
FIG. 7B

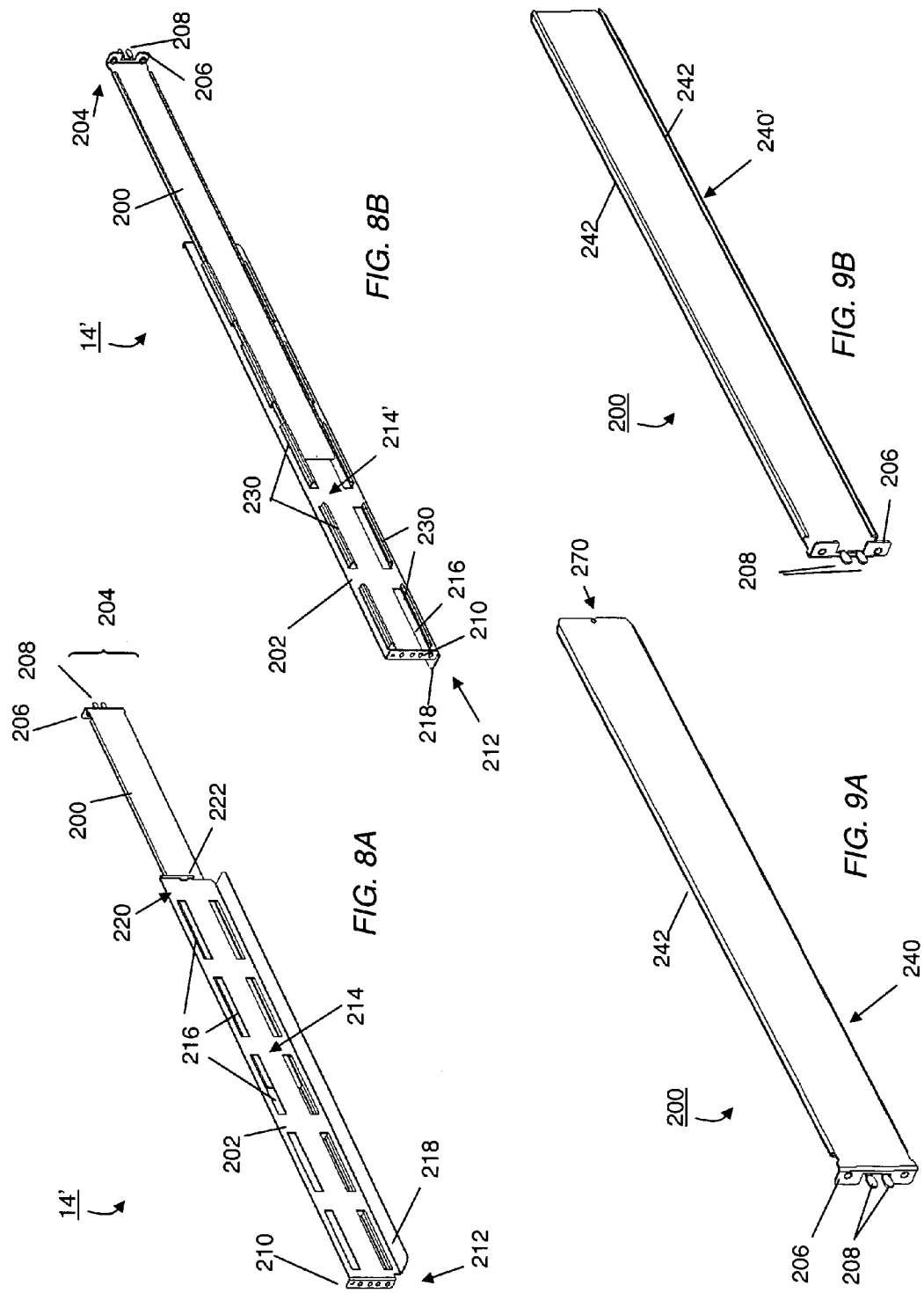

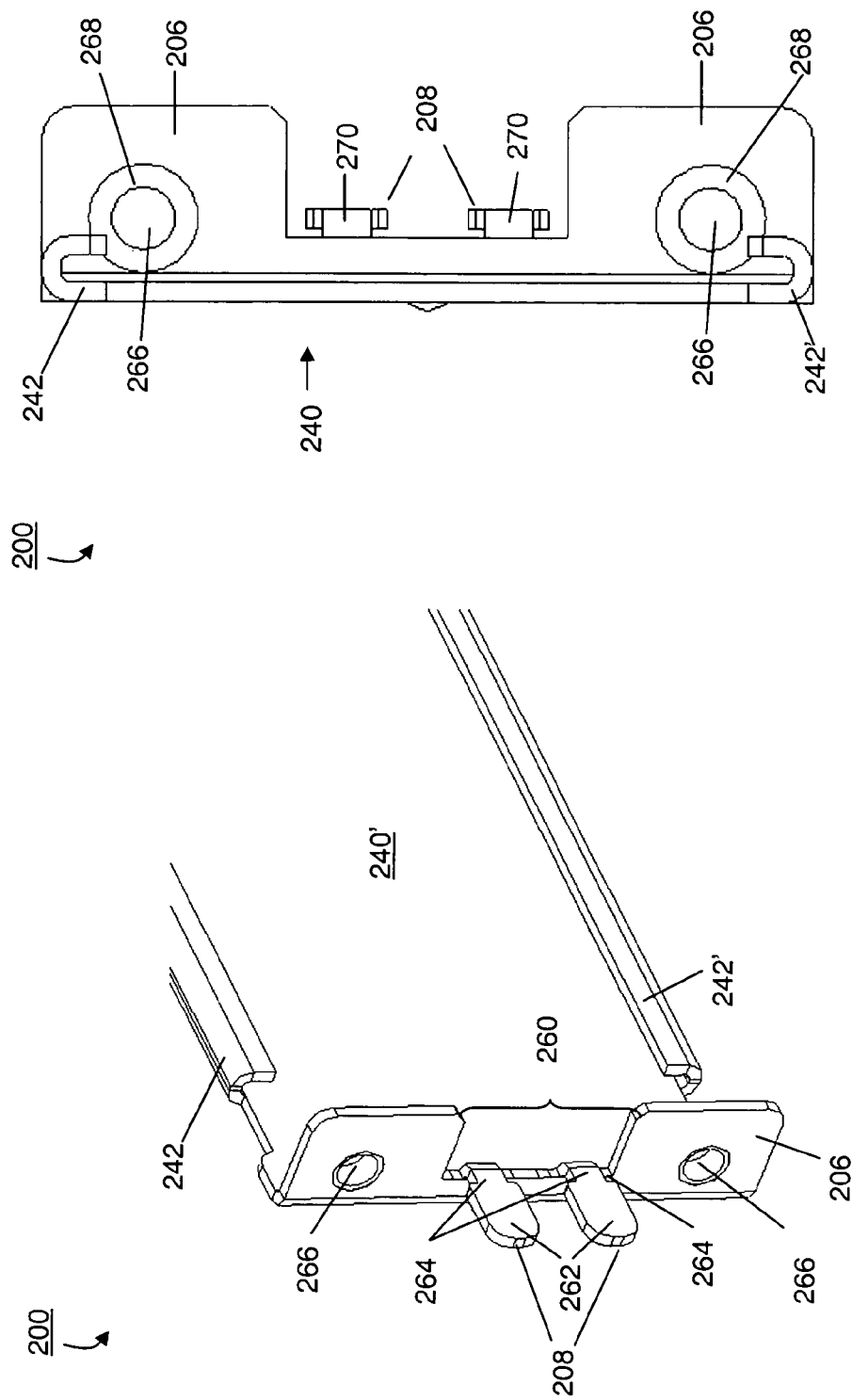

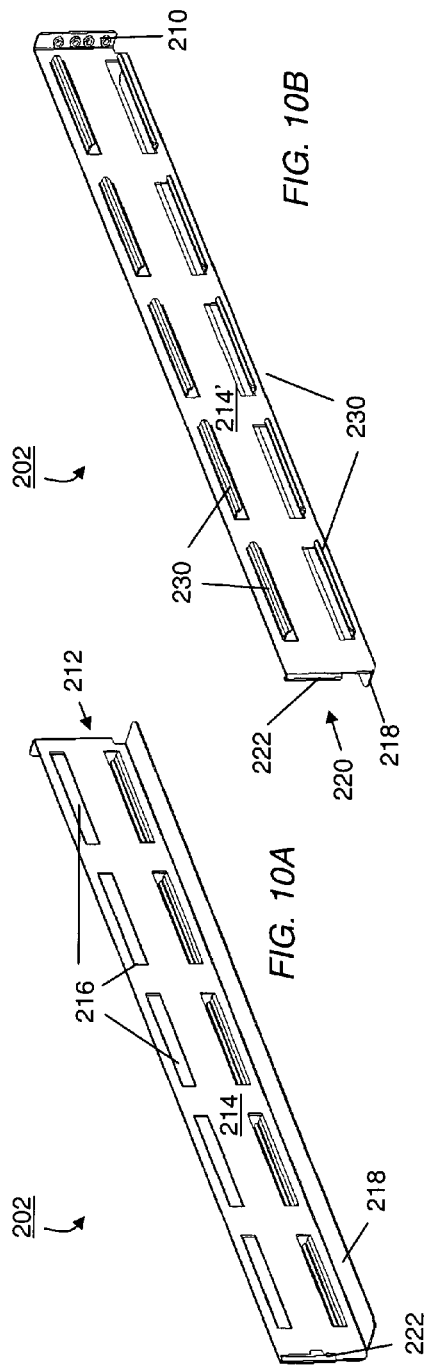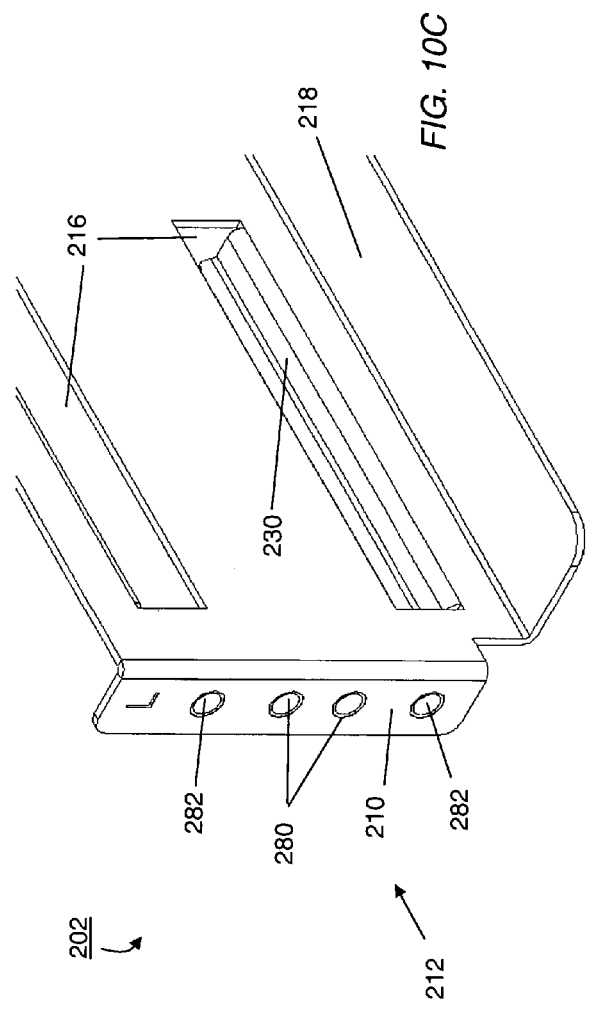

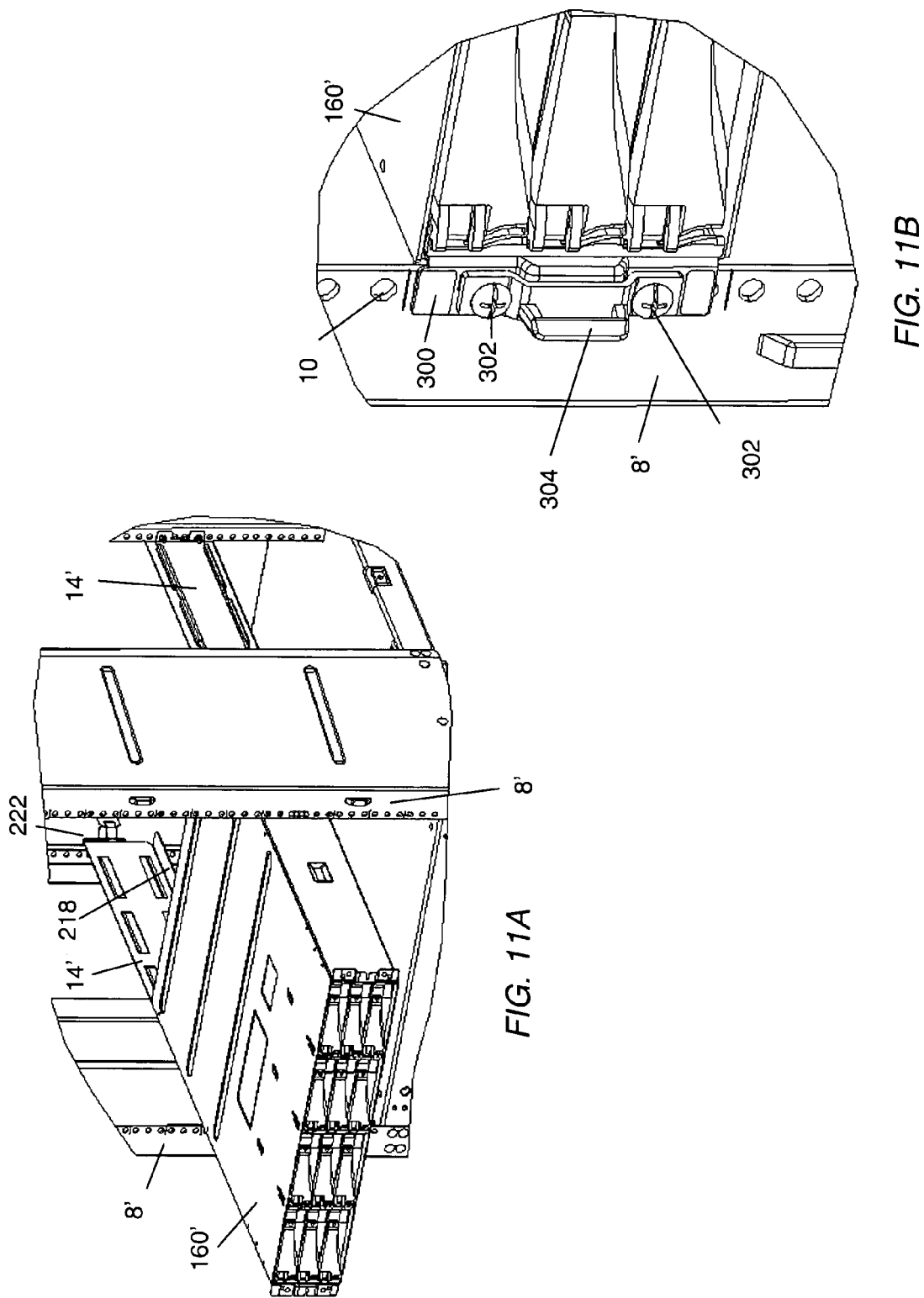

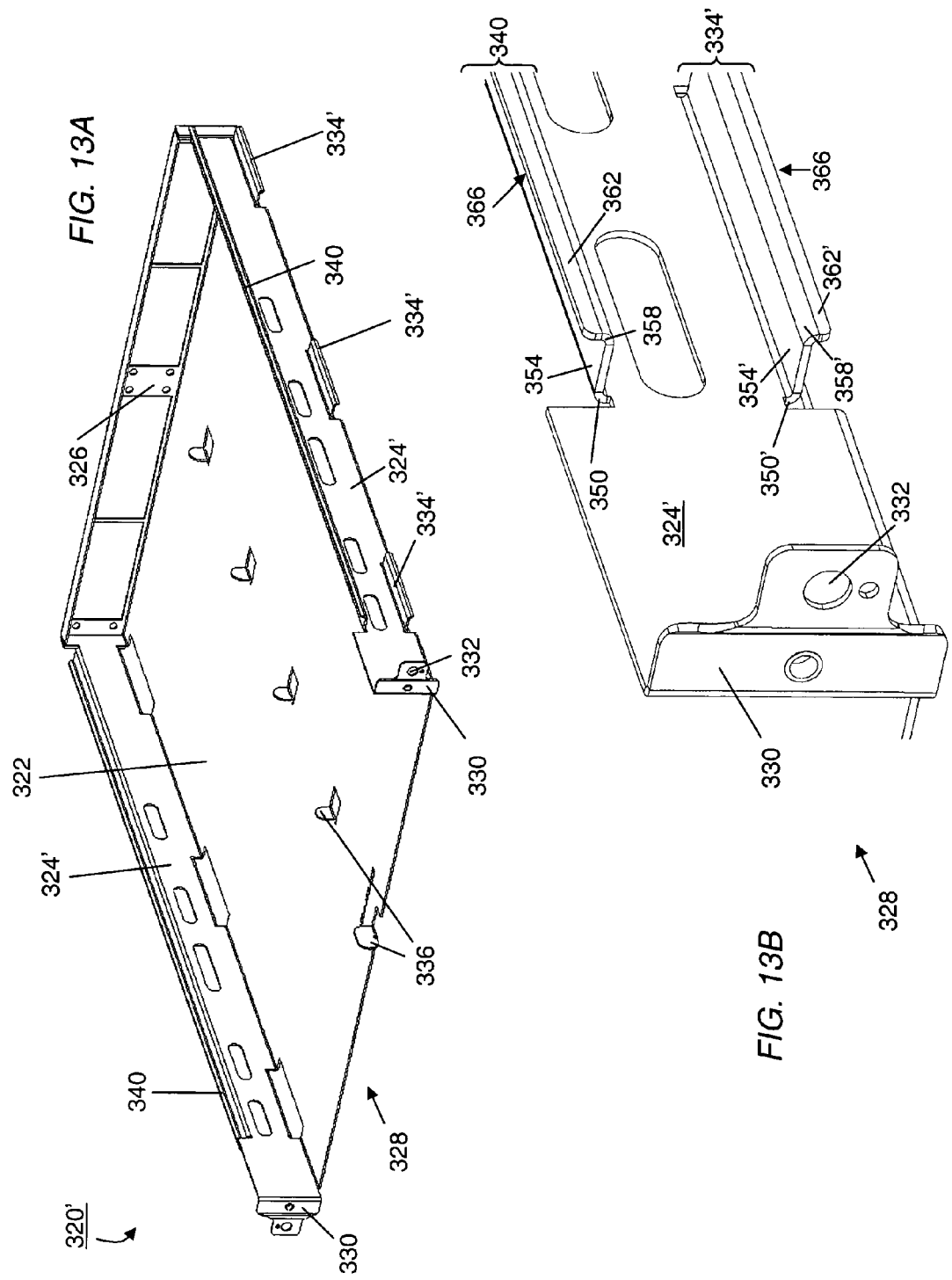

TRAY WITH INTEGRATED RAIL GUIDES FOR FACILITATING INSTALLATION OF EQUIPMENT UNITS INTO A CABINET RACK

FIELD OF THE INVENTION

The invention relates generally to cabinet racks. More particularly, the invention relates to trays with integrated rail guides for facilitating installation of equipment units into cabinet racks.

BACKGROUND

Electronic equipment is often housed in a metal framework called an equipment rack. Usually, an equipment rack contains multiple bays. Each bay holds a unit of equipment, such as a server or a switch. Racks are generally available in standard sizes. Common sizes include 19" racks and 23" racks. These dimensions correspond to the width of the rack; the height and depth of the racks can vary. Typically, each equipment unit occupies one of the bays and is secured to the rack with screws. To install a unit of equipment in a four-post rack, for example, a side rail is secured to each side of the unit of equipment. This equipment assembly is then attached to the front and back vertical structural members of the rack, herein referred to as mounting rails.

Constructing and then installing the equipment assembly can be an onerous, time-consuming task. Because the depths of the racks can vary from customer to customer, an installer typically determines the length of each side rail at the time of installing the equipment unit into the cabinet rack. Accordingly, the installer measures the distance between the front mounting rail and the back mounting rail and then constructs two side rails. Each side rail is made of two separate rail portions. The installer overlaps these rail portions and joins them to produce a unitary side rail having the measured length.

The installer then attaches the two side rails to the sides of the equipment unit and proceeds to install the equipment assembly into the cabinet. At this point, the installer learns whether there has been any error in measuring the distance between the front and back mounting rails or in the constructing of the side rails. If so, the side rails need to be removed from the sides of the equipment unit and reconstructed to the appropriate length.

Provided the side rails are of the proper length, installing the equipment assembly often requires the assistance of a second installer, because one installer alone cannot easily hold and secure the equipment assembly to the cabinet rack. Often, one installer is needed to support the equipment assembly, while the other fastens the side rails to the rear mounting rails and then to the front mounting rails with screws.

Also, in almost fully populated cabinet racks, the flanges at the ends of the side rails can impede the installation of the equipment assembly. Designed to provide a planar surface by which the side rails can be secured to the mounting rails, the flanges project substantially perpendicularly from the plane of the side rails, thus, making the equipment assembly slightly wider than the horizontal spacing between the front mounting rails. Thus, to pass the equipment assembly between the front mounting rails, the installer needs to tilt or angle the equipment assembly. If equipment is already installed in the bays immediately above and below the bay into which the equipment unit is being installed, the installed equipment prevents the tilted equipment assembly from entering the empty bay. There is, therefore, a need for a system and method of installing units of equipment into cabinet racks that avoids the aforementioned problems.

SUMMARY

In one aspect, the invention features a tray having a front end and a back end. The tray comprises a base sized for supporting a unit of electronic equipment, a back wall extending perpendicularly from the base at the back end of the tray, and opposing side walls spatially separated by the base. Each side wall extends from the front end to the back end of the tray to meet the back wall. Each side wall has a flange at the front end for attaching the tray to a mounting rail of a cabinet rack. The flange extends perpendicularly to that side wall away from the base. Each side wall has at least one upper rail guide and at least one lower rail guide extending laterally from that side wall. The at least one lower rail guide is spatially separated from and opposite to the at least one upper rail guide. The upper and lower rail guides slidably engage a portion of a side rail when the tray is installed in the cabinet rack.

In another aspect, the invention features an adjustable side rail for use in a cabinet rack. The side rail comprises a side rail portion for connecting to a first mounting rail of the cabinet rack and an equipment tray. The equipment tray has a base sized for supporting a unit of electronic equipment, a back wall extending perpendicularly from the base at a back end of the tray, and opposing side walls spatially separated by the base. Each side wall extends from the front end to the back end of the tray to meet the back wall. Each side wall has a flange at the front end for attaching the equipment tray to a second mounting rail of the cabinet rack. The flange extends perpendicularly to that side wall away from the base. Each side wall has at least one upper rail guide and at least one lower rail guide extending laterally from that side wall. The at least one lower rail guide is spatially separated from and opposite to the at least one upper rail guide. The upper and lower rail guides slidably engage the side rail portion when the tray is installed in the cabinet rack.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 3A and FIG. 3B are isometric views of opposite sides of an embodiment of an outer rail portion of the adjustable side rail shown in FIG. 2A and in FIG. 2B.

FIG. 3C is an isometric view of a back end of the outer rail portion of FIG. 3A and FIG. 3B, having a flange and a projecting tab.

FIG. 3D is an end view of a front end of the outer rail portion of FIG. 3A and FIG. 3B.

FIG. 4A and FIG. 4B are isometric views of opposite sides of an embodiment of an inner rail portion of the adjustable side rail shown in FIG. 2A and in FIG. 2B.

FIG. 4C is an isometric view of a front end of the inner rail portion of FIG. 4A and FIG. 4B.

FIG. 6A and FIG. 6B are isometric views of opposite sides of an embodiment of an equipment rail of the invention.

FIG. 6C is an exploded view of an equipment assembly including a pair of equipment rails and an equipment unit.

FIG. 7A is an isometric view of the equipment assembly of FIG. 6C being installed in the cabinet rack.

FIG. 7B is a detail view of the equipment assembly being fastened to a mounting rail of the cabinet rack.

FIG. 8A and FIG. 8B are isometric views of opposite sides of another embodiment of an adjustable side rail of the invention.

FIG. 9A and FIG. 9B are isometric views of opposite sides of an embodiment of an outer rail portion of the adjustable side rail shown in FIG. 8A and in FIG. 8B.

FIG. 9C is an isometric view of a back end of the outer rail portion of FIG. 9A and FIG. 9B, having a flange and projecting tabs.

FIG. 9D is an end view of a front end of the outer rail portion of FIG. 9A and FIG. 9B.

FIG. 10A and FIG. 10B are isometric views of opposite sides of an embodiment of an inner rail portion of the adjustable side rail shown in FIG. 8A and in FIG. 8B.

FIG. 10C is an isometric view of a front end of the inner rail portion of FIG. 10A and FIG. 10B.

FIG. 11A is an isometric view of an equipment unit being installed in the cabinet rack.

FIG. 11B is a detail view of the equipment unit being fastened to a mounting rail of the cabinet rack.

FIG. 13A is an isometric view of another embodiment of an equipment tray with integrally formed rail guides for sliding engagement with side rails or side rail portions.

FIG. 13B is a detail view of the rail guides of the equipment tray of FIG. 13A.

DETAILED DESCRIPTION

The present invention facilitates the installation of equipment units, such as servers and switches, into cabinet racks. Using adjustable side rails, equipment rails, and equipment trays of the invention, an installer is able to construct the structural support for the equipment units within a cabinet rack in less time than currently possible with existing technology. Additionally, these rails and trays enable the installer to work alone, without the assistance of a second installer, when installing equipment units, thus reducing the cost of installation.

In brief overview, the adjustable side rails of the invention have at least one tab that projects from an end of the side rail. An installer inserts each tab into a hole of a vertical support member of the cabinet rack. A notch in the tab catches an edge of the hole into which the tab is inserted. This notch anchors one end of the adjustable side rail to the vertical structural member while the installer pulls on or pushes the other end, with a lateral sliding motion, to adjust its length. After the side rail is at the desired length, the installer fastens each end of the side rail to the respective vertical support member. As a result, the installer is able to install the side rails for supporting the equipment units without having to measure precisely the depth of the cabinet rack (or, more specifically, the distance between the front and rear vertical support members).

In one embodiment, equipment rails are attached to the sides of the equipment units. The installer then horizontally inserts the equipment unit into the cabinet rack by sliding together the equipment rails and installed side rails. Because of this generally horizontal sliding motion, the installer does not need to tilt or angle the equipment unit to insert it into the bay. In another embodiment, the adjustable side rails have an integrated shelf member. After installation, the integrated shelf members of opposing side rails define the edges of a shelf onto which the installer can slide or place the equipment unit.

Equipment trays of the invention have integrated (i.e., built-in) equipment rails. These equipment rails enable the installer to slide together the equipment tray and installed side rails. After the equipment tray is in place within the cabinet rack, the installer can slide one or more equipment units onto the equipment tray. The equipment tray may need slight tilting to be inserted into the rack. The equipment tray has an open front end to permit the installer to slide the equipment unit horizontally onto the tray. Optionally, the equipment unit can be loaded in the equipment tray before the equipment tray is placed in the rack.

Figure 1:
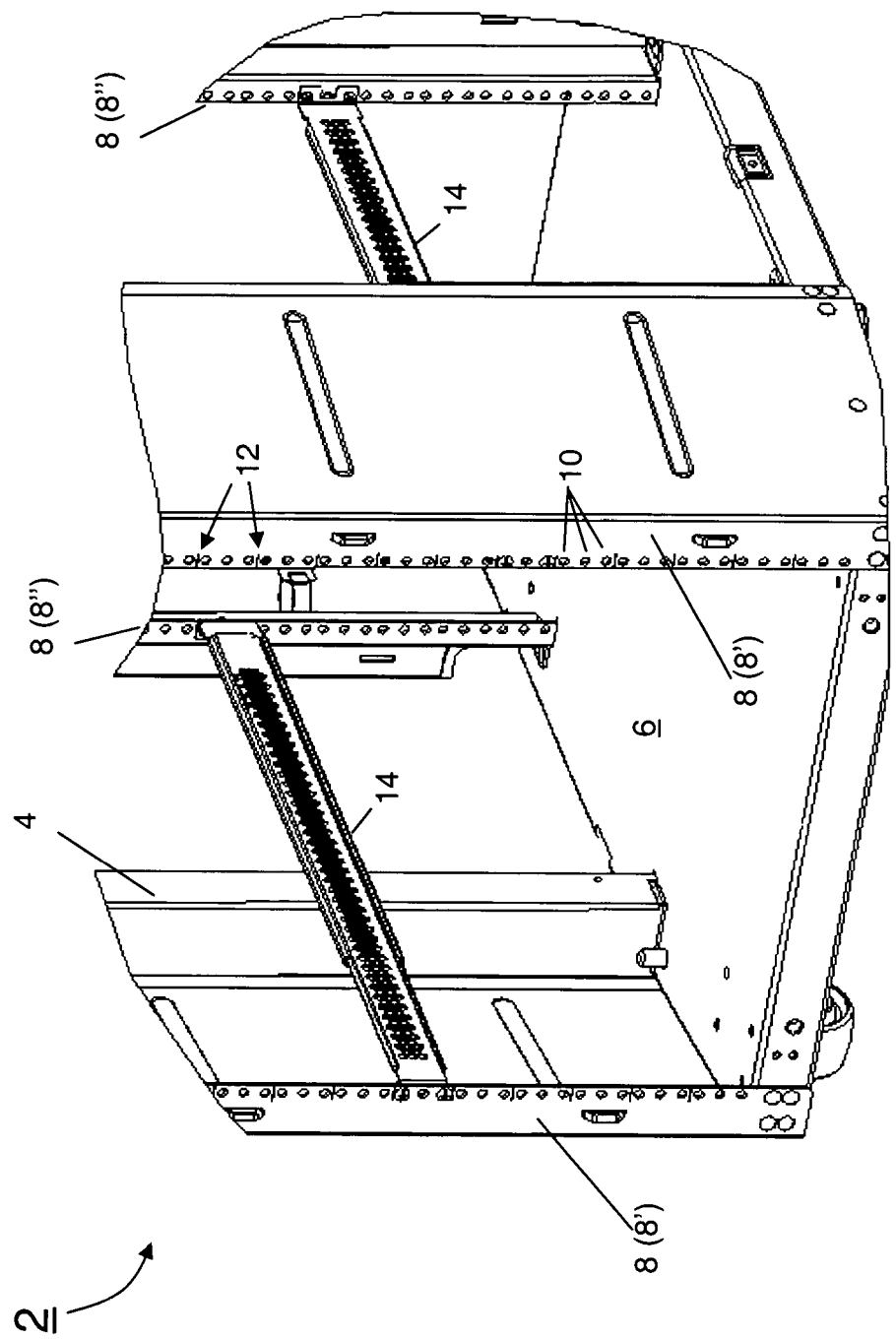
FIG. 1 is an isometric view of a lower portion of an embodiment of a cabinet rack which can employ various rails of the present invention for installing units of equipment therein.

FIG. 1 shows a lower portion of a cabinet rack 2 embodying the invention. The dimensions of the cabinet rack 2 can vary without departing from the principles of the dimensions. Generally, the cabinet rack 2 has a standard rack width, such as 19" or 23", and a height and a depth that depends upon the particular application of the rack. The cabinet rack 2 includes a metal framework 4 having a base 6 and a plurality of vertical mounting rails 8 attached to and extending perpendicularly from the base 6. Side panels of the cabinet rack 2 for enclosing the framework 4 are not shown. Here, the cabinet rack 2 has two front mounting rails (parenthetically designated 8') and two rear mounting rails (parenthetically designated 8"). As used herein, the term front means that side of the cabinet rack 2 through which an equipment unit is inserted into the cabinet rack 2. Other location descriptors, such as top, bottom, left, right, and rear (or back), are used herein with reference to the front of the cabinet rack 2.

Each mounting rail 8 includes a plurality of holes 10. The holes 10 are square or round in shape, depending on the type of mounting rail 8. Mounting rail types, for example, include Electronic Industry Association (EIA) Standard rails, which have round holes, and Universal Mounting Rails, which have square holes. The dimensions and tolerances of and spacing between the holes 10 may be defined by the National Electrical Manufacturers Association (NEMA). The EIA-310-D compliant standard, for example, specifies the spacing between holes.

On a front surface of each front mounting rail 8' are lateral indicators 12. In the embodiment shown, three holes 10 are located between each pair of lateral indicators 12. The distance between each pair of lateral indicators 12 corresponds to one unit (1U) of vertical rack space. For example, if the dimensions for one unit of vertical rack space is 1.75", two units or 2U corresponds to 3.5" of vertical rack space, three units or 3U corresponds to 5.25" of vertical rack space, and four units or 4U corresponds to 7.00" of vertical rack space. Equipment to be installed in the cabinet rack 2 is normally specified according to this rack unit dimension. An equipment unit specified as 2U occupies as much vertical rack space as a two 1U units of equipment. It is to be understood that the principles of the invention are not limited to cabinet racks with lateral indicators; the invention can be practiced in cabinet racks that do not have lateral indicators.

The cabinet rack 2 also includes a pair of adjustable side rails 14 of the invention. Each side rail 14 is connected to one of the front mounting rails 8' and to the corresponding rear mounting rail 8". Generally, the side rails 14 can be sized to support equipment of different rack unit dimensions (1U, 2U, etc). The pair of side rails 14 provides a bay into which an equipment unit (not shown) can be horizontally installed. Although only one pair of side rails 14 is shown, it is to be understood that the cabinet rack 2 can have as many pairs of side rails as bays for holding equipment units.

Figures 2A, 2B:
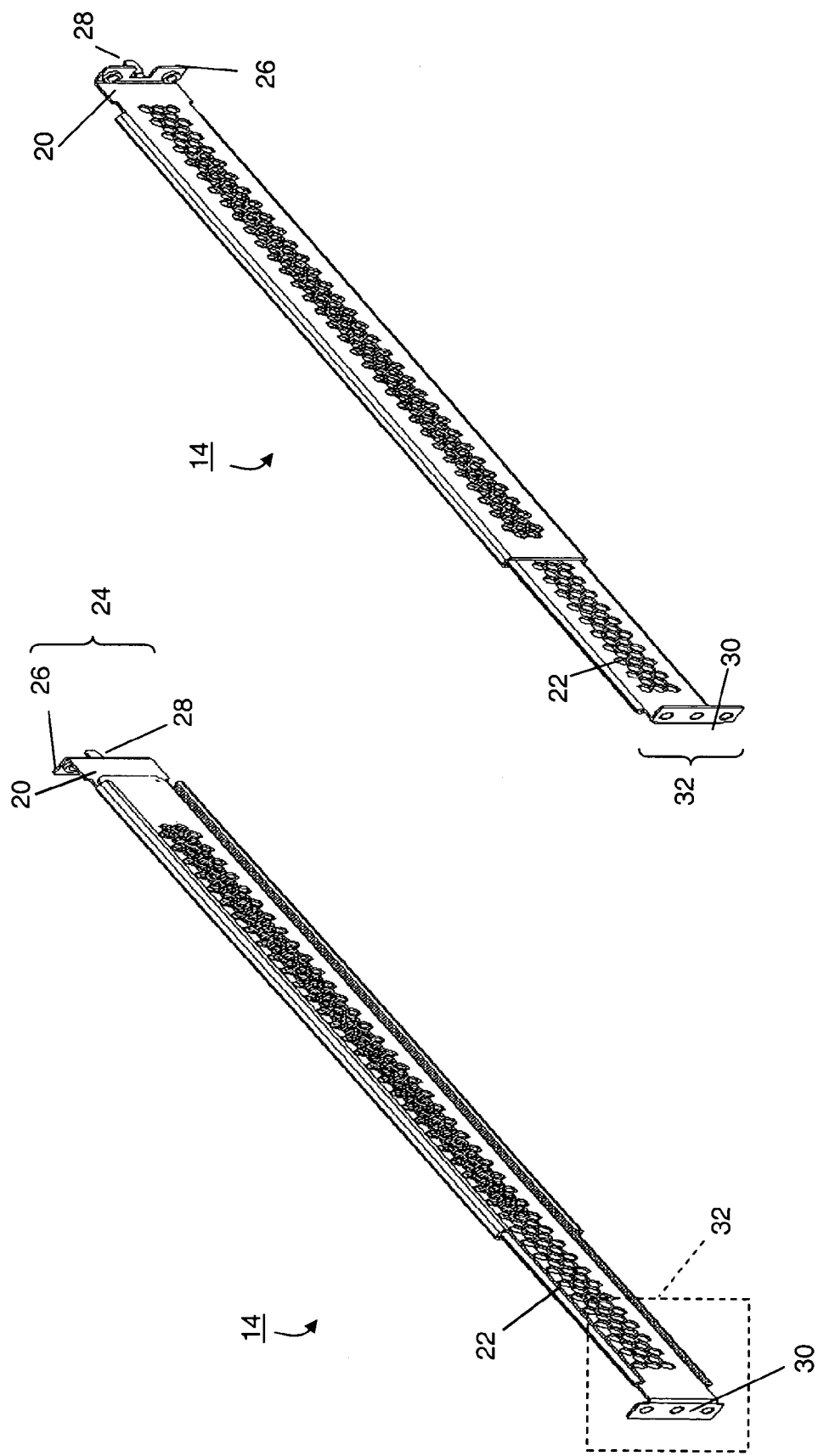
FIG. 2A and FIG. 2B are isometric views of opposite sides of an embodiment of an adjustable side rail of the invention.

FIG. 2A and FIG. 2B show one embodiment of each adjustable side rail 14 of FIG. 1. Preferably, although not necessarily, each side rail 14 is capable of attachment to either the left side or the right side of the cabinet rack 2. In FIG. 2A, the side rail 14 is shown oriented for installation on the left side of the cabinet rack 2, and, in FIG. 2B, for installation on the right side. The side rail 14 includes an elongate outer rail portion 20 and an elongate inner rail portion 22. As used herein, the terms inner and outer refer to relative positions of the rail portions with respect to each other when joined together and to the interior of the cabinet rack 2.

At a back end 24 of the outer rail portion 20, a flange 26 and a tab 28 operate to connect the side rail 14 to a rear mounting rail 8" of the cabinet rack 2, as described in more detail below. A flange 30 at a front end 32 of the inner rail portion 22 provides a structure by which to secure the side rail 14 to a front mounting rail 8'. Whether installed on the left or on the right side of the cabinet rack 2, the flange 30 extends outwardly (i.e., the flange 30 of the left side rail 14 extends toward the left of the cabinet rack 2, and the flange 30 of the right side rail 14 extends toward the right).

As shown, the inner rail portion 22 is slidably engaged within grooves 44, 44' (FIG. 3D) of the outer rail portion 20. To fit between the front and rear mounting rails 8 to which the side rail 14 is to be attached, the overall length of the side rail 14 can be adjusted by sliding the inner rail portion 22 inwards or outwards with respect to the outer rail portion 20. Such adjustments operate to increase or reduce overlap between the rail portions 20, 22. The greater the overlap between the rail portions 20, 22, the shorter the overall length of the side rail 14. The inner rail portion 22 can be separated entirely from the outer rail portion 20.

FIG. 3A and FIG. 3B show an inner side 40 and an outer side 40', respectively, of the outer rail portion 20. Top and bottom edges 42, 42', respectively, extend along a length of the outer rail portion 20 and curve inwardly toward the inner side 40 to define respective grooves 44, 44' (FIG. 3D). Each groove 44, 44' is open at a front end 46 of the outer rail portion 20 for slidably receiving a respective edge of the inner rail portion 22. Optionally, the outer rail portion 20 includes a plurality of vent openings 48 in the sides 40, 40' for the passage of air.

In one embodiment, the outer rail portion 20 is approximately 18.240 inches in length measured from the end of the tab 28 to the back end 46. The tab 28 extends approximately ½ an inch from the back surface of the flange 26 (i.e., the length of the outer rail portion 20 measured from the back surface of the flange 26 to the back end 46 is 17.740 inches). The width of the outer rail portion 20, measured from the outer edge of the flange 26 to the inner surface of the curved edge 42, is approximately 0.880 inches. The height of the outer rail portion 20, measured from the top surface of the upper edge 42 to the bottom surface of the lower edge 42', is approximately 1.720 inches.

FIG. 3C shows the back end 24 of the outer rail portion 20 in closer detail. The flange 26 extends substantially perpendicular to the sides 40, 40' of the outer rail portion 20. The flange 26 has an indented central region 60. The tab 28 projects from the indented central region 60 approximately perpendicular to a plane of the flange 26. In one embodiment, the tab 28 is spade-shaped, having a wide region 62 and a narrow region 64. The narrow region 64 extends beyond the plane of the flange 26 for a predetermined length. This predetermined length is sized to receive closely an edge of a hole 10 in a mounting rail 8. The narrow region 64 situated between the wide region 62 and the flange 26 defines a notch for catching the edge of the hole 10.

The flange 26 also includes a pair of holes 66, one hole 66 on each side of the indented central region 60, for receiving a fastener. Fasteners are inserted through holes 10 in the rear mounting rail 8" into these holes 66 to secure the back surface of the flange 26 to the front surface of a rear mounting rail 8" of the cabinet rack 2. Threaded nuts 68 (FIG. 3D), integrally formed about the holes 66 on the front surface of the flange 26, receive the fasteners.

FIG. 3D provides an end view of the outer rail portion 20 from the front end 46 to illustrate in closer detail the grooves 44, 44' formed by the curved top and bottom edges 42, 42'. In one embodiment, the top and bottom edges 42, 42' extend laterally from the side 40 approximately 0.340 inches. Also shown is the tab 28 extending from the indented central region 60 of the flange 26. The tab 28 includes a connecting portion 70 that is coplanar to the flange 26 and extends from an edge of the indented central region 60. The narrow region 64 of the tab 28 extends from the connecting portion 70 substantially perpendicularly.

FIG. 4A and FIG. 4B show an inner side 80 and an outer side 80', respectively, of the inner rail portion 22 shown in FIG. 2A and in FIG. 2B. The inner rail portion 22 includes top and bottom edges 82, 82', respectively, extending along a length of the inner rail portion 22. The top and bottom edges 82, 82' curve inwardly toward the inner side 80 to define respective grooves 84, 84'. The curvatures of the top and bottom edges 82, 82' are sized to fit closely within the respective grooves 44, 44' of the outer rail portion 20 when the back end 86 of the inner rail portion 22 slides into the open front end 24 of the outer rail portion 20. When the inner and outer rail portions 22, 20 are slidably engaged, the outer side 80' of the inner rail portion 22 faces the inner side 40 of the outer rail portion 20. Optionally, the inner rail portion 22 also includes a plurality of vent openings 88 for the passage of air.

In one embodiment, the inner rail portion 22 is approximately 23.06 inches in length measured from the front surface of the flange 30 to the back edge of the back end 86. The width of the inner rail portion 22, measured from the outer edge of the flange 30 to the inner surface of the curved edge 82, is approximately 0.805 inches. The height of the inner rail portion 22, which corresponds to the height of the flange 30, is approximately 1.720 inches. The distance between the top surface of the upper edge 82 to the bottom surface of the lower edge 82' is approximately 1.580 inches.

FIG. 4C shows the front end 32 of the inner rail portion 22 including the flange 30, top and bottom edges 82, 82', and grooves 84, 84' in closer detail. In one embodiment, the top and bottom edges 82, 82' extend laterally from the side 80 approximately 0.210 inches. The flange 30 extends approximately perpendicularly to the sides 80, 80' and includes a plurality of holes 90 for receiving a fastener. Fasteners are inserted through holes 10 in a front mounting rail 8' into these holes 90 to secure the front surface of the flange 30 to the rear surface of a front mounting rail 8'. Threaded nuts 92, integrally formed about the holes 90 on the back surface of the flange 30, receive the fasteners.

Figure 5:
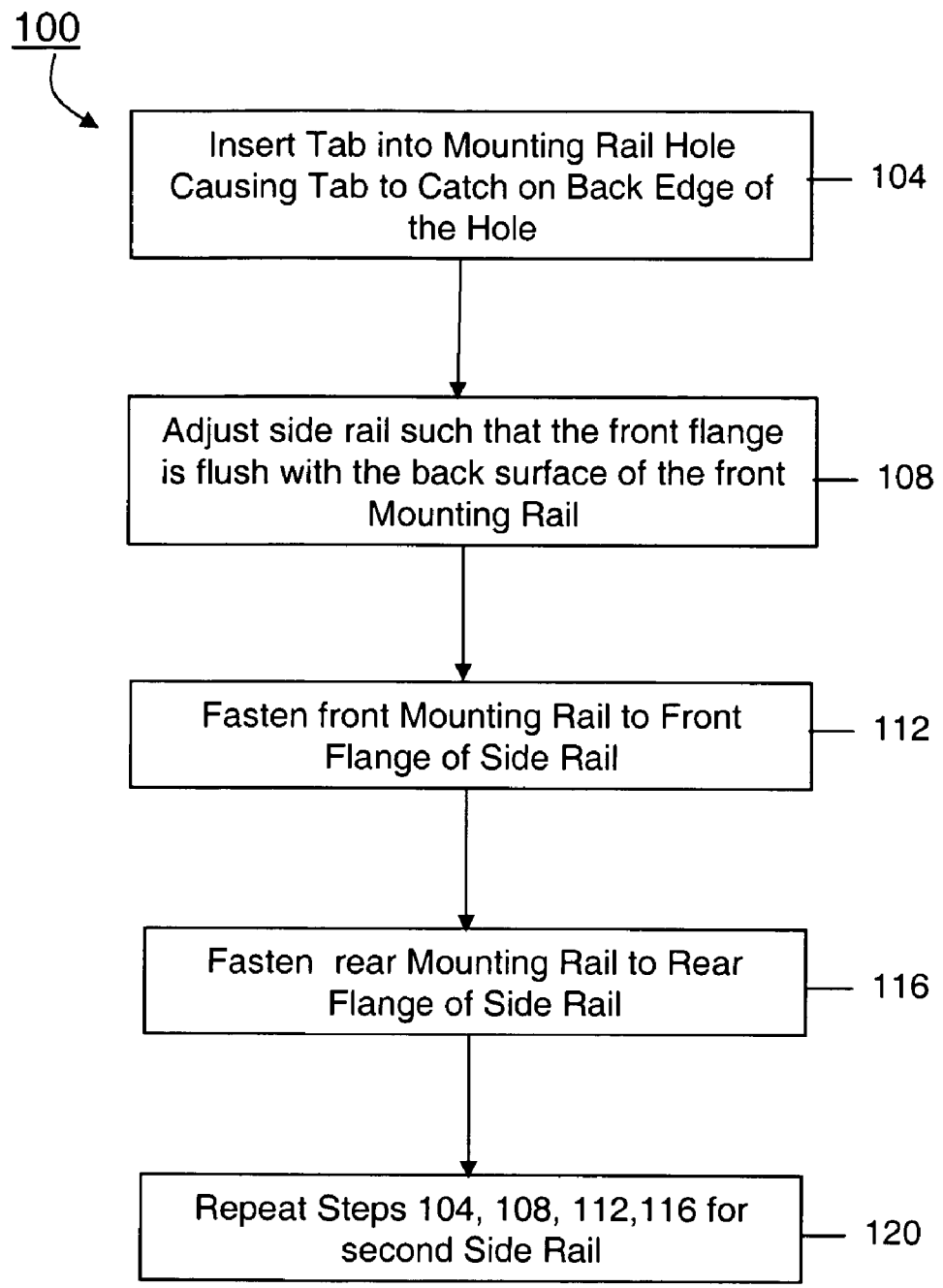
FIG. 5 is a flow chart of an embodiment of a process for installing a pair of side rails into the cabinet rack.

FIG. 5 shows an embodiment of a process 100 for installing adjustable side rails in a cabinet rack. In the description of the process 100, reference is also made to the side rails 14 described above and their various aspects. An advantage of the side rails 14 of the invention is that a single installer can perform the installation without needing assistance from a second installer or making measurements of the desired side rail length. Consequently, the installation process occurs more quickly than those installations requiring multiple installers and the taking of precise measurements.

At the start of the process 100, the inner and outer rail portions 22, 20 are slidably engaged. At step 104, the tab 28 extending from the rear flange 26 is inserted into one of the holes 10 in a rear mounting rail 8". For a 1U-sized side rail 14, for example, the tab 28 enters the center hole of the three holes 10 located between an adjacent pair of lateral markings 12. The tab 28 penetrates the hole 10 far enough to enable the notch to anchor the back end of the side rail 14 to the rear mounting rail 8" while the length of the side rail 14 is slidingly adjusted. More specifically, an edge of the mounting rail hole 10 that receives the tab 28 is wedged between a back edge of the wide region 62 and the back surface of the flange 26. This position prevents the tab 28 from being retracted from the hole 10 when the installer the adjusts (step 108) the length of the side rail 14 by extending the inner rail portion 22. The installer extends the inner rail portion 22 until the front flange 32 is flush with a back surface of the front mounting rail 8'.

At step 112, the installer aligns the holes 90 of the front flange 32 with the holes 10 of the front mounting rail 8 and inserts fasteners through the aligned holes 90, 10 into the tapped nuts 92. Similarly, the installer fastens (step 116) the rear flange 26 to the front surface of the rear mounting rail 8" by inserting fasteners through the aligned holes 10, 66 to be received by the tapped nuts 68. Steps 104, 108, 112, 116 are repeated to attach a second side rail 14 for supporting an equipment unit in the cabinet rack 2.

In one embodiment, an equipment unit is equipped for installation in the cabinet rack 2 by attaching an equipment rail to each side of the equipment unit. The resulting equipment assembly is then inserted into a bay of the cabinet rack by sliding the equipment rails into the installed side rails 14. FIG. 6A and FIG. 6B show an inner side 142 and an outer side 142', respectively, of an embodiment of an equipment rail 140 that can be used to construct an equipment assembly. At a front end 144 of the equipment rail 140 is a flange 146 that extends substantially perpendicular to the sides 142, 142'. The flange 146 has an opening 148 formed therein for receiving a fastener that secures the flange 146 to a front mounting rail 8'. The sides 142, 142' of the equipment rail 140 also include fastener openings 150 and, optionally, vent openings 152. Top and bottom edges of the equipment rail 140 have respective rail guides 154, 154' extending laterally away from a plane of the rail 140. A slight curvature of each rail guide 154, 154' produces a lip 156 (FIG. 7B) that can slide into the grooves 84, 84' of the inner rail portion 22.

FIG. 6C shows an exploded view of equipment rails 140-1, 140-2 and an equipment unit 160. The equipment rail 140-1 is secured to the left side and the equipment rail 140-2 is secured to the right side of the equipment unit 160. Fasteners inserted through the openings 150 secure the equipment rails 140-1, 140-2 to the equipment unit 160. Flanges 146 are at the front of the equipment unit 160.

FIG. 7A shows the equipment assembly of FIG. 6C, including the equipment unit 160 and equipment rails 140-1, 140-2, about to be slid into the bay of the cabinet rack 2 defined by the installed side rails 14. Equipment units may vary in width, whereas cabinet rack widths are generally standard. An advantage of the present invention is that the same adjustable side rails 14 can be used to support equipment units of different widths. The differences in width among different equipment units can be compensated for by changing the structure of the equipment rails. For example, the rail guides. 154, 154', the shape or thickness of the sides 142, or combinations thereof, can be modified to extend further from the plane of the equipment rail to accommodate narrower equipment units.

FIG. 7B shows the front flange 146 of the equipment rail 140-1, as a representative example, as fastened to the front surface of the front mounting rail 8' after the equipment unit 160 is fully inserted into the bay. A fastener 170 secures the flange 146 between a front panel catch 172 and the front surface of the front mounting rail 8'. Fasteners 174 secure the front flange 32 of the side rail 14 (not shown) to the back surface of the front mounting rail 8'.

FIG. 8A and FIG. 8B show another embodiment of each adjustable side rail 14 of FIG. 1 (here, the side rail is designated as 14'). In this embodiment, each side rail 14' is either a left side rail or a right side rail. Unlike the side rail 14 described in FIG. 2A, a given side rail 14' cannot be installed on either side of the cabinet rack 2. In FIG. 8A, the side rail 14' is designed for installation on the left side of the cabinet rack 2, and in FIG. 8B, the side rail 14' is designed for installation on the right side. Also, in this embodiment the unit dimension of the side rail 14' is 2U, although other unit dimensions can be used without departing from the principles of the invention.

The side rail 14' includes an elongate outer rail portion 200 and an elongate inner rail portion 202. At a back end 204 of the outer rail portion 200, a flange 206 and a plurality of tabs 208 operate to connect the side rail 14' to a rear mounting rail 8" of the cabinet rack 2. A flange 210 at a front end 212 of the inner rail portion 202 provides a structure by which the side rail 14' is secured to a front mounting rail 8'. When installed in the cabinet rack 2, the flange 210 extends outwardly (i.e., if on the left side, towards the left of the cabinet rack 2; if on the right side, towards the right).

In one embodiment, the inner rail portion 202 is approximately 24.57 inches in length measured from front surface of the flange 210 to the back end 220. The width of the inner rail portion 202, measured from the outer edge of the flange 210 to the inmost edge of the shelf 218, is approximately 1.54 inches; the width of the shelf 218 being approximately 0.94 inches. The height of the inner rail portion 202 is approximately 3.40 inches.

One side 214 of the inner rail portion 202 has a plurality of rectangular openings 216 that permit the passage of air. Also, a shelf 218 extends perpendicularly from a bottom edge of the side 214. The shelf 218 operates to support the equipment unit being installed. The size of the shelf 218 can vary, depending upon the size and weight of the equipment unit to be supported. At a back end 220 of the inner rail portion is a forward-pointing tab 222 that engages a corresponding slot in the rear of the equipment unit. The tab 222 limits the rearward extent to which the equipment unit can slide on the shelf 218.

On the opposite side 214' of the inner rail portion 202 are a plurality of curved rail guides 230. Each rail guide 230 is located at an edge of a corresponding opening 216, either at a top edge or at a bottom edge of the opening 216. Each rail guide 230 is formed from the material (e.g., metal) that is cut away from the side 214' and bent upwards (or downwards) to produce the corresponding opening 216. The upper and lower sets of curved rail guides 230 each form a discontinuous groove along a length of the side 214'. The upper groove is spatially separated from the lower groove by a distance that closely corresponds to the height of the outer rail portion 200.

As shown, the outer rail portion 200 is slidably engaged within the upper and lower grooves of the inner rail portion 202. To fit between the front and rear mounting rails 8, the overall length of the side rail 14' is adjusted by sliding the inner rail portion 202 inwards or outwards with respect to the outer rail portion 200. The inner rail portion 202 can also be separated entirely from the outer rail portion 200.

FIG. 9A and FIG. 9B show an inner side 240 and an outer side 240', respectively, of the outer rail portion 200. The outer rail portion 200 includes curved top and bottom edges 242, 242', respectively, extending along a length of the outer rail portion 200. The curvatures of the top and bottom edges 242, 242' produce close fits within the upper and lower discontinuous grooves, respectively, of the inner rail portion 202.

FIG. 9C shows the back end 204 of the outer rail portion 200 in closer detail. The flange 206 extends substantially perpendicular to the sides 240, 240'. The flange 206 has an indented central region 260. Tabs 208 project from the indented central region 260 approximately perpendicular to a plane of the flange 206. In one embodiment, each tab 208 is spade-shaped, having a wide region 262 and a narrow region 264. Each narrow region 264 extends beyond the plane of the flange 206 for a predetermined length. This predetermined length is sized to receive closely an edge of a hole 10 in a mounting rail 8. Each narrow region 264 being situated between the respective wide region 262 and the flange 206 defines a notch for catching the edge of the hole 10.

The flange 206 also includes a pair of holes 266, one on either side of the indented central region 260, for receiving a fastener. Fasteners are inserted through holes 10 in the rear mounting rail 8" into these holes 266 to secure the back surface of the flange 206 to the front surface of a rear mounting rail 8"'. Threaded nuts 268 (FIG. 9D), integrally formed about the holes 266 on the front surface of the flange 206, receive the fasteners.

FIG. 9D provides an end view of the outer rail portion 200 from a front end 270 (FIG. 9A) to illustrate in closer detail the curved top and bottom edges 242, 242'. Also shown are the tabs 208 extending from the indented central region 260 of the flange 206. Each tab 208 includes a connecting portion 270 that is coplanar to the flange 206 and extends from an edge of the indented central region 260. The narrow region 264 of the tab 208 extends from the connecting portion 270 substantially perpendicularly. Accordingly, each tab 208 is substantially perpendicular to the flange 206.

FIG. 10A and FIG. 10B show the inner side 214 and the outer side 214', respectively, of the inner rail portion 202 in closer detail. FIG. 10C shows the front end 212 of a left-side inner rail portion 202, as a representative example. The flange 210 includes a plurality of holes 280, 282 for receiving fasteners. Fasteners inserted through the holes 280 secure the front surface of the flange 210 to the rear surface of the front mounting rail 8'.

To connect the outer and inner rail portions 200, 202, the front end 270 of the outer rail portion 200 slides into the back end 220 of the inner rail portion 202. More specifically, when the outer and inner rail portions 200, 202 are slidably joined, the curved top and bottom edges 242, 242' of the outer rail portion 202 slide into the upper and lower discontinuous grooves defined by the curved rail guides 230 of the inner rail portion 202. Also, the inner side 240 of the outer rail portion 200 faces the outer surface 214' of the inner rail portion 202.

Connecting the adjustable side rail 14' to the front and rear mounting rails of the cabinet rack 2 is similar to the process 100 described in FIG. 5. For the adjustable side rail 14', each tab 208 that extends from the rear flange 206 is inserted into one of the holes 10 in a rear mounting rail 8"'. For a 2U-sized side rail 14', for example, the tabs 208 enter holes 10 that straddle one of lateral markings 12 on the rear mounting rail 8. The tabs 208 sufficiently penetrate their respective holes 10 to enable the notch of that tab 208 to anchor the back end of the side rail 14' to the rear mounting rail 8"'. An edge of each mounting rail hole 10 that receives a tab 208 is wedged between a back edge of the wide region 262 and the back surface of the flange 206, which prevents the tabs 208 from being retracted from their respective holes 10 when the installer the adjusts the length of the side rail 14'. Accordingly, after one end of the side rail 14' is anchored to the rear mounting rail 8"', the installer can slidingly extend the inner rail portion 202 to adjust the side rail length.

This embodiment of the adjustable side rail 14' enables the installation of an equipment unit in the cabinet rack 2 without the need to attach equipment rails on the sides of the equipment unit. FIG. 1A shows a 2U equipment unit 160' being installed in the cabinet rack 2. More specifically, the equipment unit 160' is being slid onto the shelves 218 of two opposing adjustable side rails 14' attached to the mounting rails 8 of the cabinet rack 2.

FIG. 11B shows a front flange 300 of the equipment unit rail 160' fastened to the front surface of a front mounting rail 8' after the equipment unit 160' is fully inserted into the bay. A pair of fasteners 302 secures the flange 300 between a front panel catch 304 and the front surface of the front mounting rail 8'. These fasteners 302 also pass through the holes 282 on the front flange 210 (FIG. 10C) of the side rail 14'.

Figure 12:
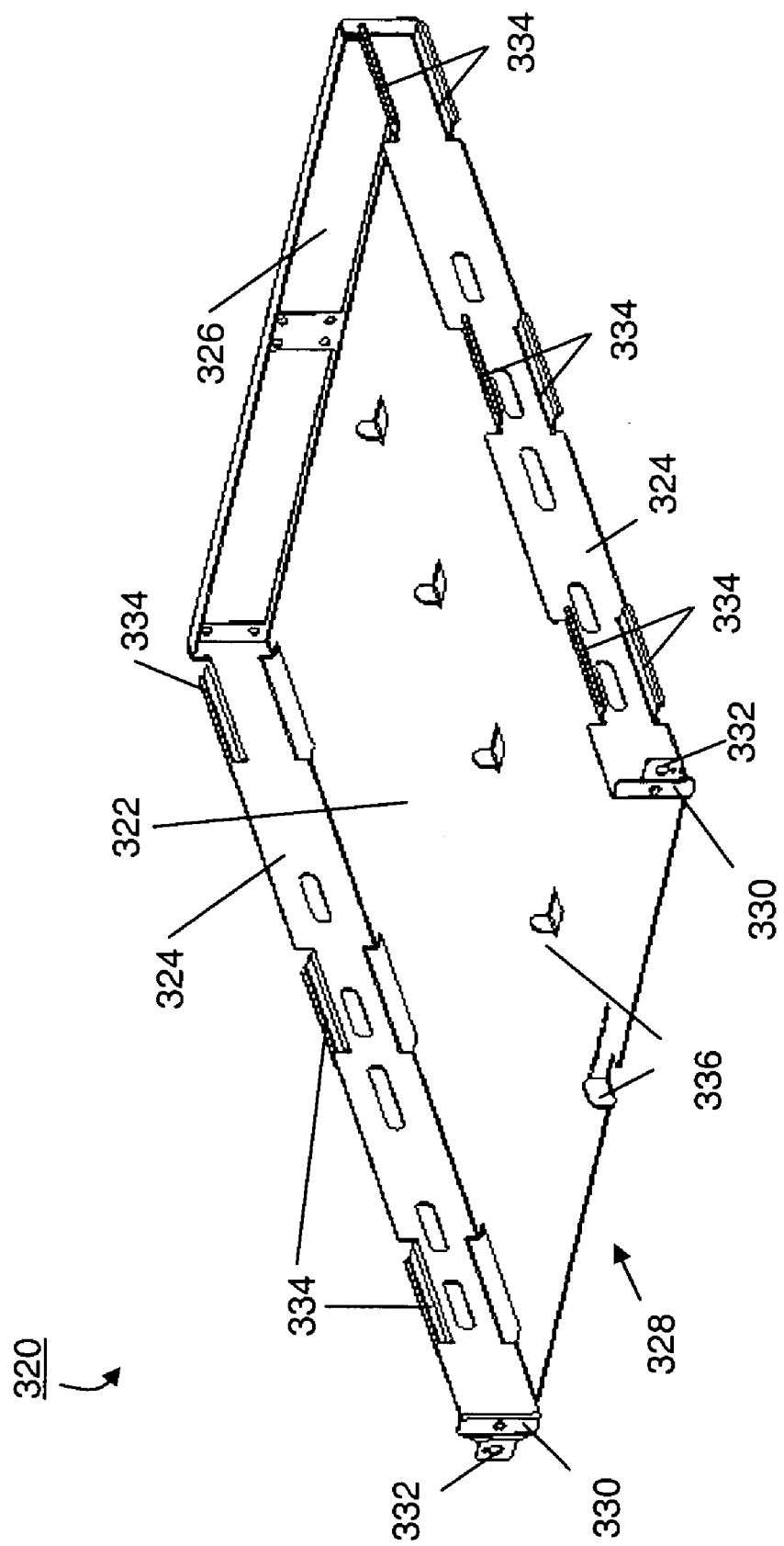
FIG. 12 is an isometric view of an embodiment of an equipment tray with integrally formed rail guides for sliding engagement with side rails or side rail portions.

FIG. 12 shows an embodiment of an equipment tray 320 including a base 322, a pair of opposing side walls 324 separated by the base 322, and a back wall 326 between the side walls 324 at a back edge of the base 322. The tray 320 also has an open end 328 at a front edge of the base 322. At the open end 328, each side wall 324 has a flange 330 extending perpendicularly to and outwardly from that side wall 324. Each flange 330 has an opening 332 through which a fastener can be received for securing the front of the tray 320 to the front mounting rails 8'.

Each side wall 324 also has a plurality of upper and lower rail guides 334 extending outwardly from a top edge or from a bottom edge of that side wall 324. In one embodiment, each upper rail guide 334 has a horizontal section that extends substantially laterally from the side wall 324, a first angled section that extends generally upwards from the horizontal section, and a second angled section that extends generally upwards from the first angled section to produce a generally upwards facing lip. Each lower rail guide 334 has a horizontal section extending substantially laterally from the side wall 324, a first angled section extending generally downwards from the horizontal section, and a second angled section extending generally downwards from the first angled section to produce a generally downwards facing lip.

In one embodiment, the upwards- and downwards-facing lips of the rail guides 334 are spatially separated and sized to be closely received within the upper and lower grooves 84, 84' of the inner rail portion 22 of the side rail 14 (FIG. 2A). In this embodiment, the equipment tray 320 is an alternative embodiment of an equipment rail 140 (FIG. 6A) and slidably couples to the side rail 14 of FIG. 1.

In another embodiment, opposing surfaces of the horizontal sections of the rail guides 334 are spatially separated to closely receive the outer rail portion 200 of the side rail 14' (FIG. 8A) between the rail guides 334. When the outer rail portion 200 is slid between these horizontal sections, the upper and lower edges 242, 242' of outer rail portion 200 abut the respective horizontal sections of the upper and lower rail guides 334. In this embodiment, the equipment tray 320 is an alternative embodiment of both the left and right inner rail portions 202 (FIG. 8A), and the equipment tray 320, in combination with the left and right outer rail portions 200, provides an alternative to the side rails 14' of FIG. 8A. To use the equipment tray 320 as part of the side rails, both outer rail portions 200 are anchored to their respective rear mounting rails 8" almost simultaneously.

For either type of embodiment, the equipment tray 320 enables the installation of an equipment unit in the cabinet rack 2 without the use of equipment rails on the sides of the equipment. To install an equipment unit in the cabinet rack 2, the installer slides the equipment unit onto the base 322 through the open end 328. For example, the equipment tray 320 can support a pair of power supply modules. A plurality of tabs 336 projects from the base 322 along a line to partition the base 322 into left and right sections. The tabs 336 operate to keep the power supply modules apart. The tabs 336 can be located along a center line to partition the base 322 into equal halves, or disposed at other locations to produce unequally sized base sections.

FIG. 13A shows another embodiment of an equipment tray 320' having similar features to the embodiment shown in FIG. 12, such as the base 322, the back wall 326, and the flanges 330. Features of the equipment tray 320' that differ from corresponding features of the equipment tray 320 in FIG. 12 include the side walls 324' and the rail guides 334'. Here, in addition to a plurality of lower rail guides 334', each side wall 324' has one upper rail guide 340 that extends along a length of and outwardly from a top edge of that side wall 324'.

FIG. 13B shows in closer detail the upper rail guide 334' and the lower rail guides 334 of the right side wall 324' of the equipment tray 320'. As shown, the upper rail guide 340 has a first curved section 350 that bends upwards away from the side wall 324', a horizontal section 354 that extends substantially laterally from the first curved section 350, a second curved section 358 that curves generally upwards from the horizontal section 354, and a third curved section 362 that extends generally upwards from the second curved section 358 to produce a generally upwards facing lip 366.

Each lower rail guide 334' has a first curved section 350' that bends downwards away from the side wall 324', a horizontal section 354' that extends substantially laterally from the first curved section 350', a second curved section 358' that curves generally downwards from the horizontal section 354', and a third curved section 362' that extends generally downwards from the second curved section 358' to produce a generally downwards facing lip 366'.

Although the invention has been shown and described with reference to specific preferred embodiments, it should be understood by those skilled in the art that various changes in form and detail may be made therein without departing from the spirit and scope of the invention as defined by the following claims.

What is claimed is:

1. A tray having a front end and a back end, comprising:
a base sized for supporting a unit of electronic equipment;
a back wall extending perpendicularly from the base at the back end of the tray; and
opposing side walls spatially separated by the base and extending perpendicularly therefrom, each side wall extending from the front end to the back end of the tray to abut the back wall, each side wall having a flange at the front end for attaching the tray to a mounting rail of a cabinet rack, the flange extending perpendicularly to that side wall away from the base, each side wall having a top edge and a bottom region that integrally joins the base, the top edge having at least one section that is cut away from the top edge and shaped to form at least one upper rail guide, the bottom region having at least one section that is cut away from the bottom region and shaped to form at least one lower rail guide, the at least one upper rail guide and the at least one lower rail guide of each side wall being integrally formed in and extending laterally from the same side of that side wall, the at least one lower rail guide being spatially separated from and opposite to the at least one upper rail guide,
the at least one upper rail guide at the top edge of each side wall having a horizontal section extending laterally from that side wall and an upwards-facing lip extending from the horizontal section in a direction away from the at least one lower rail guide at the bottom region of that side wall, the at least one lower rail guide at the bottom region of that side wall having a horizontal section extending laterally from the side wall and a downwards-facing lip extending from the horizontal section in a direction away from the at least one upper rail guide at the top edge of that side wall,
the horizontal sections of the rail guides opposing each other and having a spatial separation sized for closely receiving therebetween a first type of side rail, and the upwards-facing and downwards-facing lips having outer edges that face away from each other and that have a spatial separation sized for simultaneously entering respective grooves of a second type of side rail, the spatial separation between the outer edges of the upwards-facing and downwards-facing lips being greater than the spatial separation between the horizontal sections of the rail guides.

2. The tray of claim 1, further comprising a tab projecting perpendicularly from the base of the tray to partition the base into two sections.

3. The tray of claim 2, wherein each section is for receiving a separate unit of electronic equipment.

4. The tray of claim 1, wherein the tray is a single-piece construction.

5. The tray of claim 1, wherein the front end of the tray is open.

6. The tray of claim 1, wherein the at least one lower rail guide of each side wall includes a plurality of lower rail guides integrally formed in and extending laterally from that side wall, the lower rail guides of each side wall being in alignment along a length of that side wall for engaging the side rail when the tray is installed in the cabinet rack.

7. The tray of claim 1, wherein the at least one upper rail guide of each side wall includes a plurality of upper rail guides integrally formed in and extending laterally from that side wall, the upper rail guides of each side wall being in alignment along a length of that side wall for engaging the side rail when the tray is installed in the cabinet rack.

8. The tray of claim 1, wherein the at least one upper rail guide of each side wall includes a plurality of upper rail guides and the at least one lower rail guide of each side wall includes a plurality of lower rail guides integrally formed in and extending laterally from that side wall, each upper rail guide directly opposing one of the lower rail guides.

9. The tray of claim 1, wherein each flange has an opening through which a fastener can pass to secure the front end of the tray to a mounting rail of the cabinet rack.

10. The tray of claim 1, further comprising a row of spatially separated tabs projecting perpendicularly from the base of the tray, the row of tabs extending from the front end to the back end of the tray to partition the base into two sections.

* * * * *